(12) United States Patent
Kawabe et al.

(10) Patent No.: US 7,465,353 B2
(45) Date of Patent: Dec. 16, 2008

(54) METHOD FOR GROWING EPITAXIAL CRYSTAL

(75) Inventors: Manabu Kawabe, Toda (JP); Ryuichi Hirano, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 11/661,696

(22) PCT Filed: Jun. 6, 2005

(86) PCT No.: PCT/JP2005/010331

§ 371 (c)(1),
(2), (4) Date: Mar. 2, 2007

(87) PCT Pub. No.: WO2006/030565

PCT Pub. Date: Mar. 23, 2006

(65) Prior Publication Data

US 2007/0261631 A1    Nov. 15, 2007

(30) Foreign Application Priority Data

Sep. 17, 2004  (JP) ............................. 2004-271297

(51) Int. Cl.
*C30B 25/12*  (2006.01)

(52) U.S. Cl. .............................. 117/88; 117/84; 117/89; 117/102

(58) Field of Classification Search .................. 117/84, 117/88, 89, 102
See application file for complete search history.

(56) References Cited

FOREIGN PATENT DOCUMENTS

| JP | 4-111379 A | 4/1992 |
|----|-----------|--------|
| JP | 6-92278 B2 | 11/1994 |
| JP | 8-208397 A | 8/1996 |
| JP | 2750331 B2 | 2/1998 |
| JP | 10-64828 A | 3/1998 |
| JP | 3129112 B2 | 11/2002 |

OTHER PUBLICATIONS

Kondo et al., Journal of Applied Physics, vol. 76, No. 2, Jul. 15, 1994, pp. 914-927.

*Primary Examiner*—Felisa C Hiteshew
(74) *Attorney, Agent, or Firm*—Birch, Stewart, Kolasch & Birch, LLP

(57) ABSTRACT

It is to provide a method for growing an epitaxial crystal in which the doping conditions are set when an epitaxial crystal having a desired carrier concentration is grown. A method for growing an epitaxial crystal while a dopant is added to a compound semiconductor substrate, comprises: obtaining a relation between an off angle and a doping efficiency with regards to the same type of compound semiconductor substrate in advance; and setting a doping condition for carrying out an epitaxial growth on the compound semiconductor substrate based on the obtained relation and a value of the off angle of the subtrate.

7 Claims, 1 Drawing Sheet

METHOD FOR GROWING EPITAXIAL CRYSTAL

TECHNICAL FIELD

The present invention relates to a method for growing epitaxial crystal including a compound semiconductor. In particular, the present invention relates to a technique for easily setting doping conditions for growing epitaxial crystal having a desired carrier concentration.

BACKGROUND ART

Conventionally, for the application of a semiconductor element such as a light-emitting element or a light-receiving element, a semiconductor wafer which is obtained by epitaxially growing a III-V system compound semiconductor layer, for example, InP, on an InP substrate, has been widely used. The epitaxial layer of the compound semiconductor is formed, for example, by the metalorganic chemical vapor deposition method (hereinafter referred to as MOCVD method).

When the above-described III-V system compound semiconductor layer is epitaxially grown by the MOCVD method, minute convex defects called hillock and wrinkle defects called orange peel are caused on the surface of the epitaxial layer. As a result, a problem of deterioration of the surface morphology of the epitaxial layer, was caused. Thus, various techniques for improving the surface morphology of the epitaxial layer, have been suggested.

For example, according to Patent Publication 1, a method in which a wafer of which a plane orientation is inclined from a <100> direction by an angle of 0.1° to 0.2° is used as a substrate for epitaxial growth by the MOCVD method and a crystal is epitaxially grown at a substrate temperature of 600° C. to 700° C., has been suggested. This method is successful in remarkably reducing hillocks (called as tear-shaped defect in Patent Publication 1) in the surface of an epitaxial layer.

Furthermore, in Patent Publication 2, an epitaxial growth method in which the range of an off angle of a substrate is defined by a function of a growth rate and a substrate temperature, has been suggested in order to prevent orange peel from being caused when the off angle of is increased. By this method, hillocks caused in the surface of an epitaxial layer can be significantly reduced and the generation of orange peel can be prevented.

Furthermore, in Patent Publication 3, a method in which an off angle of a substrate is defined by additionally considering a defect density (dislocation density) of the substrate has been suggested. Specifically, when a thin film of a compound semiconductor is epitaxially grown on an InP substrate, the substrate having an off angle $\theta(°)$ from the <100> direction which satisfies a condition of $\theta \geq 1 \times 10^{-3} D^{1/2}$ ($D(cm^{-2})$: defect density of the substrate) is used. For example, when a defect density D of the substrate is 1000 $cm^{-2}$, the substrate having an off angle of $\theta \geq 0.03°$ is used. When a defect density D of the substrate is 1000 $cm^{-2}$, the substrate having an off angle of $\theta \geq 0.10°$ is used.

Furthermore, the present applicant pays attention on the micro roughness of a surface of an epitaxial layer and suggests a technique that by obtaining haze of 2 ppm or less over the entire effective use region of the substrate and by obtaining an off angle of the substrate of 0.05 to 0.10°, the surface of the epitaxial layer can be improved at a level of micro roughness (Japanese Patent Application No. 2004-079504). The term "haze" herein is defined by a value obtained by dividing the intensity of scattering light obtained when light from a predetermined light source enters the surface of the substrate by the intensity of incident light from the light source.

[Patent Publication 1] Japanese Patent No. 1975143
[Patent Publication 2] Japanese Patent No. 2750331
[Patent Publication 3] Japanese Patent No. 3129112

DISCLOSURE OF THE INVENTION

Problem to be Solved by the Invention

As described above, conventionally, by using a semiconductor substrate specifying an off angle and a dislocation density thereof or haze, and by carrying out vapor phase growth under predetermined growth conditions, a practical epitaxial layer having a favorable surface morphology could be grown.

However, when a substrate having an off angle exceeding 0.1° was used, haze was increased. The surface morphology deteriorates, and variation in a doping efficiency of epitaxial layers to be grown was caused depending on the substrate lot. A problem where a desired carrier concentration could not be obtained even when growth conditions were fixed, was caused. Therefore, conditions relating to doping efficiency (doping conditions (such as, flow rate of dopant) were required to be reset whenever the substrate lot was changed. The number of operations of crystal growth furnaces, which were required for setting doping conditions, became a few percentages of the total number of operations of the furnaces for production. Therefore, the production efficiency was deteriorated.

An object of the present invention is to provide a method for growing an epitaxial crystal in which the doping conditions are set when an epitaxial crystal having a desired carrier concentration is grown.

Means for Solving the Problem

The present invention has been made in order to solve the above problems. A method for growing an epitaxial crystal while a dopant is added to a compound semiconductor substrate, comprises: obtaining a relation between an off angle and a doping efficiency with regards to the same type of compound semiconductor substrate in advance; and setting a doping condition for carrying out an epitaxial growth on the compound semiconductor substrate based on the obtained relation and a value of the off angle of the substrate. Here, an average value of the off angles at five positions in a plane including the center of the substrate is regarded as the off angle of the substrate. The term "doping condition" means such as a dopant flow rate or the like.

For example, the relation between the off angle of the substrate and the doping efficiency can be obtained by using the compound semiconductor substrate having variation in the off angle at five positions in the plane within a predetermined range (e.g., within ±0.03°) to measure the doping efficiency in which the epitaxial crystal layer is grown while the predetermined dopant is added to the substrate and to measure the doping efficiency in which the epitaxial crystal layers are similarly grown on a plurality of substrates having different off angles.

Specifically, when the compound semiconductor substrate is an InP substrate, the doping condition is set within the range in which the off angle of the substrate is not less than 0.1°, based on a relation in which the doping efficiency is monotonically decreased as the off angle is increased, and the value of the off angle of the substrate. Specifically, when an InP substrate has an off angle exceeding 0.1°, the doping efficiency is monotonically decreased as the off angle of the substrate is increased. Thus, the doping condition may be corrected in a direction along which the dopant flow rate is increased.

Furthermore, the doping condition for achieving the epitaxial crystal having a desired carrier concentration when the substrate having a specific off angle is used, is estimated based on the relation between the off angle of the substrate and the doping efficiency; the epitaxial crystal is grown based on the estimated doping condition; and the doping condition in which the desired carrier concentration is achieved, is established as the doping condition in case of using the substrate having the specific off angle. When the doping condition is estimated in case of using the substrate having the specific off angle, the carrier concentration of the epitaxial crystal layer in which an epitaxial crystal layer is grown by using a substrate, for example, having an off angle of 0.05° to 0.1°, also may be set as a reference.

Specifically, in a conventional technique, the epitaxial growth is carried out for each substrate lot to find and reset the doping condition for a desired carrier concentration. On the other hand, it is not required to find the doping condition for each substrate lot by establishing the doping condition to a specific off angle based on the relation between the off angle of the substrate and the doping efficiency. Thus, it is possible to easily realize epitaxial crystal having a desired carrier concentration by using the established doping condition.

Furthermore, the relation between the off angle and the doping efficiency is obtained by using the compound semiconductor substrate having an in-plane variation in the off angle within ±0.03°. Because the variation in the doping efficiency, that is, the variation in a carrier concentration of the epitaxial crystal layer is within ±5%, the relation between the off angle and the doping efficiency is clarified. Furthermore, when the relation between the off angle and the doping efficiency is obtained by using the compound semiconductor substrate having the variation in the off angle in the plane of the substrate within ±0.02°, the variation in the carrier concentration of an epitaxial crystal layer is within ±3%. Thus, the relation between the off angle and the doping efficiency is further clarified.

In case that a plurality of different substrates are used, when the variation in the off angles of the substrates is within ±0.03°, the same doping condition can be applied. Therefore, even when different substrates are used, the variation in the doping efficiency, that is, the variation in a carrier concentration of an epitaxial crystal layer, can be within ±3%.

Hereinafter, the process for achieving the present invention will be described.

First, in order to solve the problem in which even though the growth conditions of the epitaxial crystal are fixed, the doping efficiency to the epitaxial layer is varied depending on the substrate lot, and a test run for setting the doping condition must be performed to achieve a desired carrier concentration, the present inventors have investigated the relation between the substrate lot and the carrier concentration of the grown epitaxial crystal. Specifically, by using InP substrates having various characteristics (carrier concentration, dopant concentration, off angle and the like), the epitaxial crystal was grown by the MOCVD method while the dopant is added to the substrate at a predetermined flow rate to measure the carrier concentration in the epitaxial crystal and to calculate a value (doping efficiency) normalized by the dopant flow rate.

As a result, it was found that the doping efficiency changes depending on the off angle of the InP substrate and particularly when the off angle exceeds 0.1°, the carrier concentration of the epitaxial crystal tends to be reduced. Here, the average value of off angles at five positions in a plane including the center of the substrate is referred to as the off angle of the substrate. It was also found that, when the substrates having the same off angle are used, by using an InP substrate having an in-plane variation in an off angle within ±0.03°, the variation in the doping efficiency, that is, the variation in the carrier concentration of the epitaxial crystal layer, was within ±5%. Furthermore, it was found that by using an InP substrate having an in-plane variation of off angle within ±0.02°, the variation in the doping efficiency was within 3%.

When the doping efficiency of the epitaxial crystal grown by using a substrate having an off angle exceeding 0°, was represented by the ratio to the doping efficiency of the epitaxial crystal grown by using a substrate (just) having an off angle of 0°, it was also found that there was a relation shown in FIG. 1 between the off angle of the substrate and the doping efficiency. Specifically, in FIG. 1, it was found that the ratio of the doping efficiency is almost 1 in a range where the off angle is not more than 0.1°, and that the ratio of the doping efficiency was monotonically decreased when the off angle exceeds 0.1°.

Thus, the present inventors found that by using the relation as described above, it was possible to reduce the number of test runs required for finding the doping condition (for example, dopant flow rate) for growing epitaxial crystal. Specifically, in FIG. 1, when a substrate having an off angle of 0.1° or less is used, the determined doping condition can be applied without correcting the condition. On the other hand, when a substrate having an off angle exceeding 0.1° is used, it is predicted that the condition must be changed, for example, so as to increase a dopant flow rate. Thus, the doping condition for growing a desired epitaxial crystal can be set by the small number of test runs.

Although it is determined by repeating experiments through a trial and error process how much the correction is performed depending on the off angle of the substrate, after the doping condition is determined, the determined doping condition can be used. Therefore, the subsequent setting of the doping condition is remarkably easier. For example, when the substrate having the off angle of 0.15° is used, as long as it can be demonstrated by the experiment that a desired carrier concentration can be obtained by setting a dopant flow rate so as to be 1.05 times higher than a dopant flow rate in case of using a substrate having an off angle of 0.1° or less, the doping condition can be used in case of using the substrate having an off angle of 0.15°.

Furthermore, in FIG. 1, it was also found that when the variation in the off angle of the substrates was within ±0.03° (0.17 to 0.23°) in case that the off angle of the substrate was near 0.2°, the variation in the doping efficiency was within ±5%. Thus, in case of the substrate having the off angle as described above, the epitaxial crystal having a desired carrier concentration can be grown even when the doping conditions are the same.

In case that the off angle is 0.1° or less, the doping efficiency to the off angle is not changed. Thus, the variation in the doping efficiency is not influenced by the variation in the off angle. The variation in the doping efficiency becomes the variation in other growth conditions (about within ±2%).

Effect of the Invention

According to the present invention, the change in the doping efficiency to the off angle of the substrate can be easily found from the relation between the off angle of the substrate and the doping efficiency which is obtained in advance. Thus, it can be easily predicted how the doping condition, such as the dopant flow rate, should be corrected depending on the off angle of the substrate to be used.

Therefore, it is not required to carry out the epitaxial growth for every substrate lot to find and set the doping condition for a desired carrier concentration. Thus, the doping condition for growing the epitaxial crystal having a desired carrier concentration can be established by the small number of test runs. As a result, it is possible to remarkably improve the production efficiency.

BEST MODE FOR CARRYING OUT THE INVENTION

Figure 1:
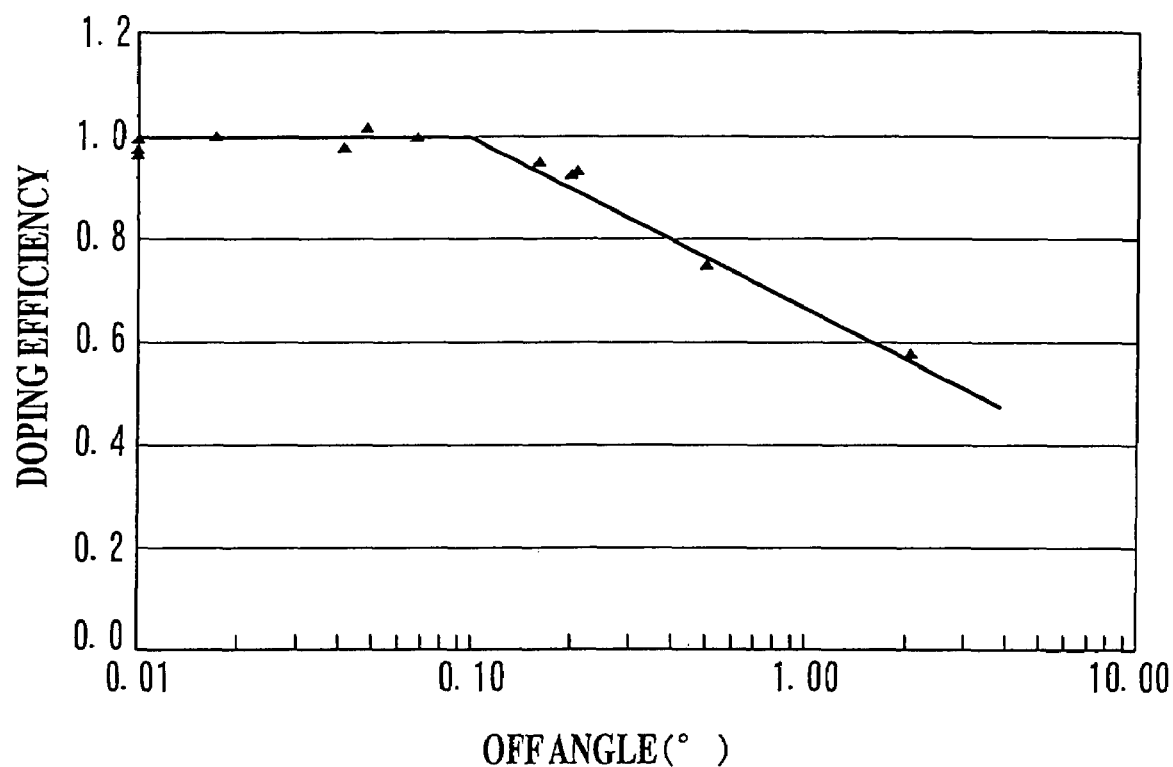
[FIG. 1] This is a graph illustrating a relation between an off angle of a substrate and a doping efficiency.

Hereinafter, a preferred embodiment of the present invention will be described with reference the drawings.

First, by the Liquid Encapsulated Czochralski (LEC) method, an S-doped InP single crystal having a diameter of 2 inch and having a plane orientation of (100), was prepared. Then, the InP single crystal was cut to provide a substrate for epitaxial growth. Then, a normal mirror finishing was carried out for the surface of this InP single crystal so that the substrate had an off angle of 0.00° to 5.0° from a <100> direction. It is noted that the variation in the off angle in the substrate was ±0.03°.

By using these InP substrates, an epitaxial crystal was grown by the MOCVD method while $H_2S$ (hydrogen sulfide) was added as a dopant to the substrates at a predetermined flow rate. Then, the carrier concentration and haze of the epitaxial crystal were measured.

(1) By using an InP just substrate having an S-doped concentration of $4 \times 10^{18}$ cm$^{-3}$ and having a thickness of 350 μm, an InP epitaxial crystal layer having a thickness of 1 μm was formed by the MOCVD method. At this time, the dopant flow rate was 110 sccm. In the obtained epitaxial crystal layer, the haze was 3.87 ppm and the carrier concentration was $1.2 \times 10^{18}$ cm$^{-3}$.

(2) By using an InP substrate having an off angle of 0.07°, an S-doped concentration of $4 \times 10^{18}$ cm$^{-3}$, and a thickness of 350 μm, an InP epitaxial crystal layer having a thickness of 1 μm was formed by the MOCVD method. At this time, the dopant flow rate was 110 sccm. In the obtained epitaxial crystal layer, the haze was 1.35 ppm and the carrier concentration was $1.2 \times 10^{18}$ cm$^{-3}$.

(3) By using an InP substrate having an off angle of 0.15°, an S-doped concentration of $4 \times 10^{18}$ cm$^{-3}$, and a thickness of 350 μm, an InP epitaxial crystal layer having a thickness of 1 μm was formed by the MOCVD method. At this time, the dopant flow rate was 110 sccm. In the obtained epitaxial crystal layer, the haze was 2.5 ppm and the carrier concentration was $1.14 \times 10^{18}$ cm$^{-3}$. When the doping efficiency was represented by a ratio to a doping efficiency in case of using a substrate having an off angle of 0.07°, the ratio was 0.95.

(4) By using an InP substrate having an off angle of 0.21°, an S-doped concentration of $3 \times 10^{18}$ cm$^{-3}$, and a thickness of 350 μm, an InP epitaxial crystal layer having a thickness of 1 μm was formed by the MOCVD method. At this time, the dopant flow rate was 110 sccm. In the obtained epitaxial crystal layer, the haze was 80 ppm and the carrier concentration was $1.11 \times 10^{18}$ cm$^{-3}$ and the ratio of the doping efficiency was 0.93.

(5) By using an InP substrate having an off angle of 2.00°, an S-doped concentration of $3 \times 10^{18}$ cm$^{-3}$, and a thickness of 350 μm, an InP epitaxial crystal layer having a thickness of 1 μm was formed by the MOCVD method. At this time, the dopant flow rate was 5.5 sccm. In the obtained epitaxial crystal layer, the haze was 24 ppm and the carrier concentration was $3.4 \times 10^{16}$ cm$^{-3}$. Because the carrier concentration was $5.9 \times 10^{16}$ cm$^{-3}$ in case of using a substrate having an off angle of 0.07°, the ratio of the doping efficiency was 0.58.

By performing the same experiments as those of the above experiments (1) to (5), a relation between an off angle and a doping efficiency with regards to the S-doped InP substrate was obtained (FIG. 1). It is found that the S-doped concentration of a substrate has no influence on the relation between an off angle and a doping efficiency.

EXAMPLE 1

By using InP substrate having an off angle of 0.15°, a diameter of 2 inches, an S-doped concentration of $4 \times 10^{18}$ cm$^{-3}$, and a thickness of 350 μm, an InP epitaxial crystal layer having a thickness of 1 μm and a target carrier concentration $1.2 \times 10^{18}$ cm$^{-3}$ was formed by the MOCVD method. Then, by considering the decrease of a doping efficiency to an off angle of 0.15° based on FIG. 1, the dopant flow rate was 1.05 times higher than that of the experiment (3). In the obtained epitaxial crystal layer, the haze was 2.5 ppm which is the same result as that of the above experiment (3). However, the carrier concentration was $1.18 \times 10^{18}$ cm$^{-3}$ that is closer to the target value.

EXAMPLE 2

By using a plurality of InP substrates having an off angle of 0.15±0.03°, a diameter of 2 inches, an S-doped concentration of $4 \times 10^{18}$ cm$^{-3}$, and a thickness of 350 μm, InP epitaxial crystal layers having a thickness of 1 μm and a target carrier concentration $1.2 \times 10^{18}$ cm$^{-3}$ were formed by the MOCVD method. Then, by considering the decrease of a doping efficiency to an off angle of 0.15° based on FIG. 1, the dopant flow rate was 1.05 times higher than that of the experiment (3). In the obtained epitaxial crystal layer, the haze was 2.5 ppm which is the same result as that of the above experiment (3). However, the carrier concentration was 1.17 to $1.22 \times 10^{18}$ cm$^{-3}$ that is closer to the target value. It is noted that in only InP substrates having an off angle of 0.15±0.02°, the carrier concentration was 1.19 to $1.22 \times 10^{18}$ cm$^{-3}$.

EXAMPLE 3

By using a plurality of InP substrates having an off angle of 0.05 to 0.10°, a diameter of 2 inches, an S-doped concentration of $6 \times 10^{18}$ cm$^{-3}$, and a thickness of 350 μm, InP epitaxial crystal layers having a thickness of 1 μm and a target carrier concentration $4.8 \times 10^{17}$ cm$^{-3}$ were formed by the MOCVD method. Then, because the carrier concentration of an epitaxial crystal layer was $4.8 \times 10^{17}$ cm$^{-3}$ in case of using a substrate having an off angle of 0.05° and in case of the doping flow rate of 47 sccm, the same doping flow rate was set in the present example. In the obtained epitaxial crystal layer, the haze was 1.04 to 1.35 ppm, the carrier concentration was $4.8 \pm 0.1 \times 10^{17}$ cm$^{\times 3}$, and the ratio of the doping efficiency was 1.0. Specifically, as shown in FIG. 1, the correction of doping conditions were not required in a range of an off angle of not more than 0.1°.

In the present example, for example, in a production run in which a doping condition (dopant flow rate) is previously known when a substrate having an off angle of 0.15° is used, the desired carrier concentration can be achieved by correcting the dopant flow rate to a rate which is 1/1.05 times higher than the dopant flow rate in case of using a substrate having an off angle of 0.15°.

As described above, in the Embodiment, an S-doped InP substrate in which an in-plane variation of an off angle was within a predetermined range (±0.03°), was used. An epitaxial crystal layer was grown while a predetermined dopant was added to the substrate. The relation between an off angle of the substrate and a doping efficiency was obtained. The doping conditions for the epitaxial growth on the InP substrate were set based on the above obtained relation and the off angle value of the substrate to be used.

Thereby, based on the relation between the off angle and the doping efficiency shown in FIG. 1, the change in the doping efficiency to the off angle of the substrate can be easily found to estimate how doping conditions, such as, dopant flow rate, are corrected depending on the off angle of the substrate to be used. Then, optimal doping conditions can be established in the reduced number of test runs.

For example, in the above embodiment, because the doping efficiency was reduced when the off angle was 0.15°, it was attempted that the doping conditions were corrected in a direction along which a dopant flow rate was increased. As a result, by setting the dopant flow rate so as to be 1.05 times higher than the previous one, it was confirmed that the epitaxial crystal layer had a desired carrier concentration. This was set as doping conditions in case that an off angle was 0.15°.

Therefore, it is possible to reduce the number of test runs for actually carrying out the epitaxial growth for each substrate lot to find and set doping conditions for a desired carrier concentration. It is possible to remarkably improve the production efficiency.

As described above, the invention made by the present inventors is specifically described based on the embodiment. However, the present invention is not limited to the above embodiment. The modification can be carried out without departing from the gist of the present invention.

For example, an example in which an InP layer is epitaxially grown on an InP substrate, is explained in the above embodiment, the present invention also can be applied to a case in which a III-V system compound semiconductor layer other than the InP is epitaxially grown on an InP substrate. It is considered that the present invention is not limited to a case where an InP substrate is used, and that the present invention also can be applied to a general epitaxial growth using other compound semiconductor substrates.

In this case, by calculating a relation between an off angle of a substrate and a doping efficiency depending on the type of a compound semiconductor substrate, the type of epitaxial crystal, or the type of dopant, the doping conditions can be calculated like the above embodiment.

The invention claimed is:

1. A method for growing an epitaxial crystal while a dopant is added to a compound semiconductor substrate,
   wherein off angles which are measured at a plurality of positions in a plane of the compound semiconductor substrate we measured off angles and an average value thereof is an average off angle; and
   wherein in case that a doping efficiency to the epitaxial crystal is constant when the average off angle of the compound semiconductor substrate is not more than a predetermined angle; and that the doping efficiency is monotonically decreased when the average off angle is larger than the predetermined angle, the method comprises:
   using the same type of compound semiconductor substrate, in which an in-plane variation of the measured off angles is within a predetermined range, in advance;
   obtaining at least the doping efficiency in case that the average off angle of the substrate is not more than the predetermined angle, and the doping efficiency in case that the average off angle of the substrate is larger than the predetermined angle, respectively, and establishing a relation equation between the average off angle and the doping efficiency based on the obtained average off angle and the obtained doping efficiency;
   substituting an average off angle of a substrate to be used for the relation equation to calculate a doping efficiency in case of using the substrate to be used, and setting a doping condition for carrying out an epitaxial growth on the compound semiconductor substrate based on the calculated doping efficiency and the doping efficiency which is constant when the average off angle of the substrate is not more than the predetermined angle: and
   wherein the average off angle is 0.01° to 10°.

2. The method for growing the epitaxial crystal as claimed in claim 1, wherein the compound semiconductor substrate is InP and the predetermined angle is 0.10°.

3. The method for growing the epitaxial crystal as claimed in claim 1, wherein the doping condition for achieving the epitaxial crystal having a desired carrier concentration when the substrate having a specific average off angle is used, is estimated based on the relation between the average off angle of the substrate and the doping efficiency; the epitaxial crystal is grown based on the estimated doping condition; and the doping condition in which the desired carrier concentration is achieved, is established as the doping condition in case of using the substrate having the specific average off angle.

4. The method for growing the epitaxial crystal as claimed in any one of claims 1 to 3, wherein the relation between the off angle and the doping efficiency is obtained by using the compound semiconductor substrate having an in-plane variation in the measured off angles within ±0.03°.

5. The method for growing epitaxial crystal as claimed in any one of claims 1 to 3, wherein the relation between the off angle and the doping efficiency is obtained by using the compound semiconductor substrate having the in-plane variation in the measured off angles within ±0.02°.

6. The method for growing epitaxial crystal as claimed in any one of claims 1 to 3, wherein the same doping condition is applied to the substrates having the average off angle which is within ±0.03°.

7. The method as claimed in claim 1, wherein the average off angle is 0.01° to 2°.

* * * * *